US011795573B2

United States Patent
Mori et al.

(10) Patent No.: US 11,795,573 B2
(45) Date of Patent: Oct. 24, 2023

(54) METHOD OF MANUFACTURING GROUP III NITRIDE CRYSTAL BY REACTING AN OXIDIZING GAS CONTAINING NITROGEN WITH A GROUP III ELEMENT DROPLET AND GROWING A GROUP III NITRIDE CRYSTAL ON A SEED SUBSTRATE

(71) Applicants: OSAKA UNIVERSITY, Osaka (JP); Panasonic Corporation, Osaka (JP)

(72) Inventors: Yusuke Mori, Osaka (JP); Masashi Yoshimura, Osaka (JP); Masayuki Imanishi, Osaka (JP); Akira Kitamoto, Osaka (JP); Junichi Takino, Osaka (JP); Tomoaki Sumi, Osaka (JP); Yoshio Okayama, Osaka (JP)

(73) Assignees: OSAKA UNIVERSITY, Osaka (JP); PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 17/359,949

(22) Filed: Jun. 28, 2021

(65) Prior Publication Data
US 2022/0002904 A1    Jan. 6, 2022

(30) Foreign Application Priority Data
Jul. 3, 2020  (JP) .................................. 2020-115825

(51) Int. Cl.
| C30B 25/16 | (2006.01) |
| C30B 25/02 | (2006.01) |
| H01L 21/02 | (2006.01) |
| C23C 16/30 | (2006.01) |
| C30B 29/40 | (2006.01) |

(52) U.S. Cl.
CPC ............ *C30B 25/02* (2013.01); *C23C 16/303* (2013.01); *C30B 29/406* (2013.01); *H01L 21/0254* (2013.01); *H01L 21/0262* (2013.01)

(58) Field of Classification Search
CPC ......... C30B 25/00; C30B 25/02; C30B 25/10; C30B 25/14; C30B 25/16; C30B 25/165; C30B 25/18; C30B 25/20; C30B 29/00; C30B 29/10; C30B 29/40; C30B 29/403; C30B 29/406; C23C 16/22; C23C 16/30; C23C 16/401; C23C 16/303; H01L 21/0254; H01L 21/0262
USPC ............................. 117/84, 88, 102, 937, 952
See application file for complete search history.

(56) References Cited

U.S. PATENT DOCUMENTS

| 2002/0037599 A1* | 3/2002 | Ishida .................. H01L 21/0242 |
| | | 257/E33.074 |
| 2012/0295418 A1* | 11/2012 | Melnik ............... H01L 21/0262 |
| | | 257/E21.108 |
| 2016/0268129 A1* | 9/2016 | Mori .................. H01L 21/02645 |

FOREIGN PATENT DOCUMENTS

WO    2015/053341    4/2015

* cited by examiner

*Primary Examiner* — Kenneth A Bratland, Jr.
(74) *Attorney, Agent, or Firm* — Wenderoth, Lind & Ponack, L.L.P.

(57) ABSTRACT

A method of manufacturing a group III nitride crystal according to a first aspect includes: preparing a seed substrate; generating a group III element oxide gas; supplying the group III element oxide gas; supplying a nitrogen element-containing gas; supplying an oxidizing gas containing nitrogen element containing at least one selected from the group consisting of NO gas, $NO_2$ gas, $N_2O$ gas, and $N_2O_4$ gas; and growing the group III nitride crystal on the seed substrate.

3 Claims, 4 Drawing Sheets

METHOD OF MANUFACTURING GROUP III NITRIDE CRYSTAL BY REACTING AN OXIDIZING GAS CONTAINING NITROGEN WITH A GROUP III ELEMENT DROPLET AND GROWING A GROUP III NITRIDE CRYSTAL ON A SEED SUBSTRATE

CROSS-REFERENCE TO RELATED APPLICATIONS

This application claims a priority of Japanese Patent Application No. 2020-115825 filed on Jul. 3, 2020, the contents of which is incorporated herein by reference.

BACKGROUND

1. Technical Field

The technical field relates to a method of manufacturing a group III nitride crystal.

2. Description of the Related Art

Group III nitride crystals of GaN etc. are expected to be applied to next-generation optical devices such as high-output LEDs (light emitting diodes) and LDs (laser diodes), and next-generation electronic devices such as high-output power transistors mounted on EVs (electric vehicles) and PHVs (plug-In hybrid vehicles). An Oxide Vapor Phase Epitaxy (OVPE) method using a group III oxide as a raw material is used as a method of manufacturing a group III nitride crystal, as shown in WO 2015/053341.

An example of a reaction system in the OVPE method is as follows. Ga is heated, and $H_2O$ gas is Introduced in this state. The introduced $H_2O$ gas reacts with Ga to generate $Ga_2O$ gas (Formula (I)). NH gas is introduced and reacted with the generated $Ga_2O$ gas to generate a GaN crystal on a seed substrate (formula (II)).

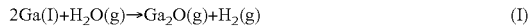

$$2Ga(l) + H_2O(g) \rightarrow Ga_2O(g) + H_2(g) \quad (I)$$

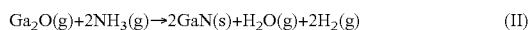

$$Ga_2O(g) + 2NH_3(g) \rightarrow 2GaN(s) + H_2O(g) + 2H_2(g) \quad (II)$$

SUMMARY

However, in the manufacturing method described in WO 2015/053341, when a group III nitride crystal is grown, a droplet of a group III metal element is generated, which causes polycrystallization in which a surface different from a growth surface is oriented by using the droplet as a starting point, and this makes it difficult to uniformly produce a high-quality crystal in the growth surface. Addition of $H_2O$ gas has been proposed for suppressing the droplet of the group III metal element; however, although the polycrystallization is suppressed by the addition of $H_2O$ gas, the $H_2O$ gas etches GaN and therefore poses a problem that a growth rate tends to decrease.

The present disclosure was conceived in view of the situations and it Is therefore one non-limiting and exemplary embodiment provides a method of manufacturing a group III nitride crystal suppressing polycrystallization and achieving a high growth rate.

In one general aspect, the techniques disclosed here feature: a method of manufacturing a group III nitride crystal according to a first aspect includes: preparing a seed substrate;
generating a group III element oxide gas;
supplying the group III element oxide gas;
supplying a nitrogen element-containing gas;
supplying an oxidizing gas containing nitrogen element containing at least one selected from the group consisting of NO gas, $NO_2$ gas, $N_2O$ gas, and $N_2O_4$ gas; and
growing the group III nitride crystal on the seed substrate.

According to the method of manufacturing a group III nitride crystal of the present disclosure, the polycrystallization is suppressed, and a group III nitride crystal can be manufactured at a high growth rate.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1:
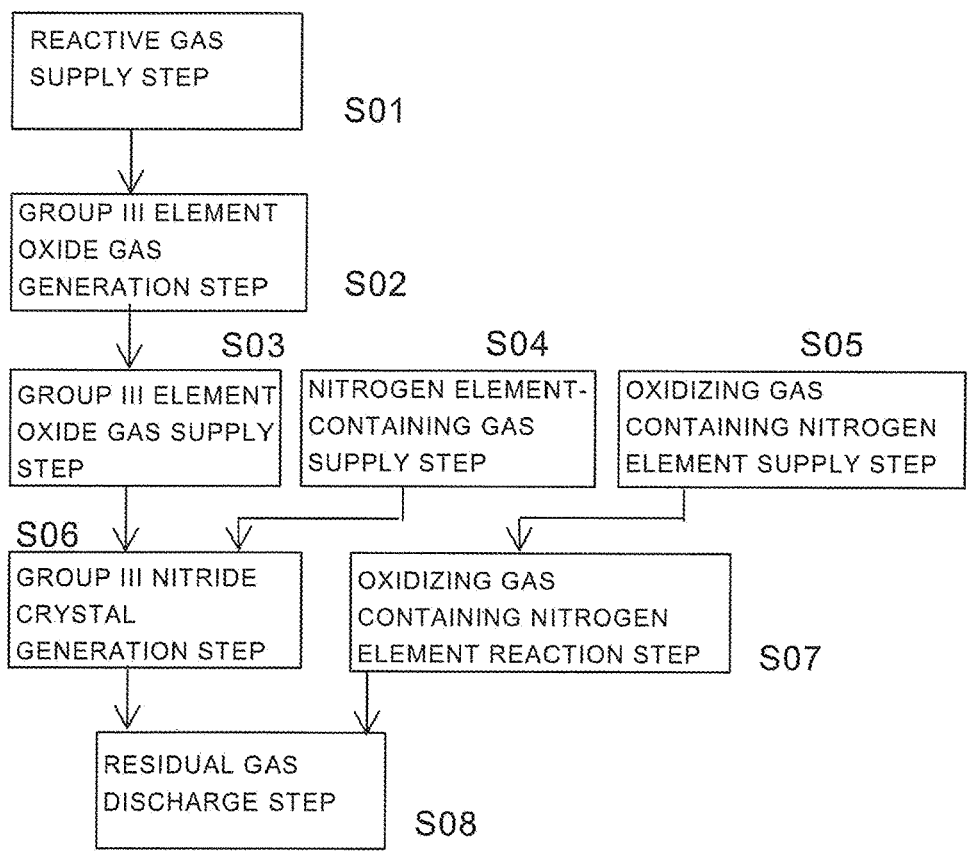
FIG. 1 is a flowchart showing a method of manufacturing a group III nitride crystal according to a first embodiment of the present disclosure.

<Overview of Method of Manufacturing Group III Nitride Crystal>

A method of manufacturing a group III nitride crystal according to a first aspect includes:
preparing a seed substrate;
generating a group III element oxide gas;
supplying the group III element oxide gas;
supplying a nitrogen element-containing gas;
supplying an oxidizing gas containing nitrogen element containing at least one selected from the group consisting of NO gas, $NO_2$ gas, $N_2O$ gas, and $N_2O_4$ gas; and
growing the group III nitride crystal on the seed substrate.

In the method of manufacturing a group III nitride crystal of the present disclosure, the oxidizing gas containing nitrogen element is supplied, so that even if a group III element droplet is generated in a crystal growth process, the oxidizing gas containing nitrogen element can be reacted with the group III element droplet. Therefore, the polycrystallization of the group III nitride crystal can be prevented. Therefore, the group III nitride crystal having excellent quality can be obtained. Additionally, since the oxidizing gas containing nitrogen element is unlikely to cause an etching reaction with the formed group III nitride crystal, the growth rate of the group III nitride crystal can be increased.

Further, as a method of manufacturing a group III nitride crystal according to a second aspect, in the first aspect, further may include:

reacting the oxidizing gas containing nitrogen element with a group III element droplet.

Further, as a method of manufacturing a group III nitride crystal according to a third aspect, in the first aspect, the oxidizing gas containing nitrogen element may be supplied at a partial pressure of $7.00 \times 10^{-4}$ atm or more and $1.75 \times 10^{-3}$ atm or less.

Further, as a method of manufacturing a group III nitride crystal according to a fourth aspect, in the first aspect, the oxidizing gas containing nitrogen element may be supplied at a partial pressure of $7.60 \times 10^{-4}$ atm or more and $1.30 \times 10^{-3}$ atm or less.

Further, as a method of manufacturing a group III nitride crystal according to a fifth aspect, in the first aspect, the oxidizing gas containing nitrogen element may be supplied before the seed substrate reaches a substrate maximum achieving temperature.

Further, as a method of manufacturing a group III nitride crystal according to a sixth aspect, in the first aspect, the oxidizing gas containing nitrogen element may be supplied before the seed substrate reaches the substrate temperature of 1050° C.

Hereinafter, a manufacturing method and a manufacturing apparatus of a group III nitride crystal according to embodiments will be described with reference to the accompanying drawings. In the drawings, substantially the same members are denoted by the same reference numerals.

First Embodiment

An overview of the method of manufacturing a group III nitride crystal according to a first embodiment of the present disclosure will be described with reference to a flowchart of FIG. 1. The method of manufacturing a group III nitride crystal according to the first embodiment includes a reactive gas supply step (S01), a group III element oxide gas generation step (S02), a group III element oxide gas supply step (S03), a nitrogen element-containing gas supply step (S04), an oxidizing gas containing nitrogen element supply step (S05), a group III nitride crystal generation step (S06), an oxidizing gas containing nitrogen element reaction step (S07), and a residual gas discharge step. (S08).

(a) At the reactive gas supply step, a reactive gas is supplied to a raw material reaction chamber (S01).

(b) At the group III element oxide gas generation step, a starting group III element source is reacted with a reactive gas (a reducing gas when the starting group III element source is an oxide, or an oxidizing gas when the starting group III element source is a metal) to generate a group III element oxide gas (S02).

(c) At the group II element oxide gas supply step, the group III element oxide gas manufactured at the group III element oxide gas generation step is supplied to a growth chamber (S03).

(d) At the nitrogen element-containing gas supply step, a nitrogen element-containing gas is supplied to the growth chamber (S04).

(e) At the oxidizing gas containing nitrogen element supply step, an oxidizing gas containing nitrogen element is supplied to the growth chamber (S05).

(f) At the group III nitride crystal generation step, the group III element oxide gas supplied into the growth chamber at the group III element oxide gas supply step is reacted with the nitrogen element-containing gas supplied into the growth chamber at the nitrogen element-containing gas supply step to manufacture a group III nitride crystal (S06).

(g) At the oxidizing gas containing nitrogen element reaction step, a group III metal droplet generated on the group III nitride crystal is reacted with the oxidizing gas containing nitrogen element supplied at the oxidizing gas containing nitrogen element supply step.

(h) At the residual gas discharge step, an unreacted gas not contributing to the generation of the group III nitride crystal is discharged out of the chamber (S08).

Through the steps described above, the group III nitride crystal can be generated on a seed substrate.

<Overview of Manufacturing Apparatus of Group III Nitride Crystal>

An overview of a group III nitride crystal manufacturing apparatus according to the first embodiment of the present disclosure will be described with reference to a schematic showing a configuration of a group III nitride crystal manufacturing apparatus 150 of FIG. 2. Constituent members shown in FIG. 2 may be different from actual members in terms of size, ratio, etc.

In the group III nitride crystal manufacturing apparatus 150 according to the first embodiment, a raw material reaction chamber 101 is disposed in a raw material chamber 100, and a raw material boat 104 with a starting group III element source 105 placed therein is disposed in the raw material reaction chamber 101. A reactive gas supply pipe 103 supplying a reactive gas reactive with the starting group III element source 105 is connected to the raw material reaction chamber 101. The raw material reaction chamber 101 has a group III element oxide gas discharge port 107. The reactive gas is a reducing gas when the starting group III element source 105 is an oxide or an oxidizing gas when the starting group III source 105 is a metal. The raw material chamber 100 is provided with a first carrier gas supply port 102, and the group III element oxide gas and a carrier gas supplied from the first carrier gas supply port 102 flow from a group III element oxide gas and carrier gas discharge port 108 through a connection pipe 109 into a growth chamber 111. The growth chamber 111 has a group III element oxide gas and carrier gas supply port 118, an oxidizing gas containing nitrogen element supply port 112, a nitrogen element-containing gas supply port 113, a second carrier gas supply port 114, and an exhaust port 119 and includes a substrate susceptor 117 on which a seed substrate 116 is disposed.

<Details of Manufacturing Method and Manufacturing Apparatus of Group III Nitride Crystal>

Details of a method of manufacturing a group II nitride crystal according to the first embodiment will be described. In the description of the first embodiment, a metal Ga is used as the starting group III element source 105.

(1) At the reactive gas supply step, the reactive gas is supplied from the reactive gas supply pipe 103 to the raw material reaction chamber 101.

(2) At the group III element oxide gas generation step, the reactive gas supplied to the raw material reaction chamber 101 at the reactive gas supply step reacts with the metal Ga serving as the starting group III element source 105 to generate a $Ga_2O$ gas that is the group III element oxide gas. The generated $Ga_2O$ gas is discharged from the raw material reaction chamber 101 through the group III element oxide gas discharge port 107 to the raw material chamber 100. The discharged $Ga_2O$ gas is mixed with a first carrier gas supplied from the first carrier gas supply port 102 to the raw material chamber and is supplied to the group III element oxide gas and carrier gas discharge port 108. At this step, for example, the temperature of the raw material chamber 100 heated by a first heater 106 may be set equal to or greater than 800° C., which is higher than the boiling point of the $Ga_2O$ gas, and less than 1800° C. so that the temperature is made lower than the growing chamber 111 heated by a second heater 115. The starting group III element source 105 is placed in the raw material boat 104. The raw material boat 104 may have a shape capable of increasing a contact area between the reactive gas and the starting group III element source 105.

Methods of generating the group III element oxide gas are roughly classified into a method of reducing the starting group ill element source 105 and a method of oxidizing the starting Ga source 105. For example, in the reducing method, an oxide (e.g., $Ga_2O_3$) is used as the starting group III element source 105, and a reducing gas (e.g., $H_2$ gas, CO gas, $CH_4$ gas, $C_2H_6$ gas, $H_2S$ gas, $SO_2$ gas) is used as the reactive gas. On the other hand, in the oxidizing method, a non-oxide (e.g., liquid Ga) is used as the starting group III element source 105, and an oxidizing gas (e.g., $H_2O$ gas, $O_2$ gas, CO gas, NO gas, $N_2O$ gas, $NO_2$ gas, $N_2O_4$ gas) is used as the reactive gas. In addition to the Ga source, an in source and an Al source may be used as the starting group III element source 105. The first carrier gas may be an inert gas, $H_2$ gas, etc.

(3) At the group III element oxide gas supply step, the $Ga_2O$ gas generated at the group III element oxide gas generation step is supplied through the group III element oxide gas and carrier gas discharge part 108, the connection pipe 109, and the group III element oxide gas and carrier gas supply port 118 to the growth chamber 111. When the temperature of the connection pipe 109 connecting the raw material chamber 100 and the growth chamber 111 is lower than the temperature of the raw material chamber 100, a reverse reaction of the reaction for generating the group III element oxide gas may occur, and the starting group III element source 105 may precipitate inside the connection pipe 109. Therefore, the connection pipe 109 may be heated by a third heater 110 so as to prevent the temperature from becoming lower than the temperature of the raw material chamber 100.

(4) At the nitrogen element-containing gas supply step, the nitrogen element-containing gas is supplied from the nitrogen element-containing gas supply port 113 to the growth chamber 111. Examples of the nitrogen element-containing gas include $NH_3$ gas, NO gas, $NO_2$ gas, $N_2O_4$ gas, $N_2H_2$ gas, and $N_2H_4$ gas.

(5) At the oxidizing gas containing nitrogen element supply step, the oxidizing gas containing nitrogen element is supplied from the oxidizing gas containing nitrogen element supply port 112 to the growth chamber 111. By supplying the oxidizing gas containing nitrogen element, as described later, a group ill element droplet can be reacted with the oxidizing gas containing nitrogen element to remove the group III element droplet. The oxidizing gas containing nitrogen element includes at least one selected from the group consisting of NO gas, $NO_2$ gas, $N_2O$ gas, and $N_2O_4$ gas.

(6) At the group III nitride crystal generation step, the raw material gases supplied through the supply steps into the growth chamber 111 are combined to manufacture a group III nitride crystal. The growth chamber 111 is heated by the second heater 115 to a temperature at which the group III element oxide gas reacts with the nitrogen element-containing gas. In this case, to prevent the reverse reaction of the reaction for generating the group III element oxide gas from occurring, the growth chamber 111 may be heated so that the temperature of the growth chamber 111 does not become lower than the temperature of the raw material chamber 100 and the temperature of the connecting pipe 109. The temperature of the growth chamber 111 heated by the second heater 115 is, for example, 1000° C. or higher and 1800° C. or lower.

(7) By mixing the group III element oxide gas supplied to the growth chamber 111 through the group III element oxide gas supply step and the nitrogen element-containing gas supplied to the growth chamber 111 through the nitrogen element-containing gas supply step upstream of the seed substrate 116, the group III nitride crystal can be grown on the seed substrate 116.

<Suppression of Polycrystallization of Group III Nitride Crystal>

The quality of the group III nitride crystal can be improved by suppressing the polycrystallization of the group III nitride crystal to be grown. Causes of generation of polycrystals include generation of group II element droplets caused by decomposition of a group III nitride crystal. To suppress the polycrystallization, a method of adding an oxidizing gas (e.g., $H_2O$ gas) and reacting the oxidizing gas with a group III element droplet to remove the group III element droplet may be used. However, the oxidizing gas may etch the generated group III nitride crystal. On the other hand, in this disclosure, the oxidizing gas containing nitrogen element is used, so that an etching reaction of the group III nitride crystal hardly occurs. Therefore, the growth rate of the group III nitride crystal can be prevented from decreasing due to etching, and the growth rate of the group III nitride crystal can be increased.

For example, when the group III nitride crystal is gallium nitride and $H_2O$ gas is used as the oxidizing gas, a decomposition reaction is represented by Formula (III), and a group III element droplet removal reaction is represented by Formula (IV). The etching reaction is represented by the reverse reaction of the GaN generation reaction represented by Formula (II) described above.

$$2GaN(I) \rightarrow Ga(g) + \tfrac{1}{2}N_2(g) \tag{III}$$

$$2Ga(g) + H_2O(g) \rightarrow Ga_2O(g) + H_2(g) \tag{IV}$$

On the other hand, for example, when $N_2O$ gas is used as the oxidizing gas containing nitrogen element, the removal reaction of the group III element droplet can be represented by Formula (V), and the etching reaction as represented by the reverse reaction of Formula (II) does not occurs.

$$2Ga(g) + N_2O(g) \rightarrow Ga_2O(g) + N_2(g) \tag{V}$$

Figure 3:
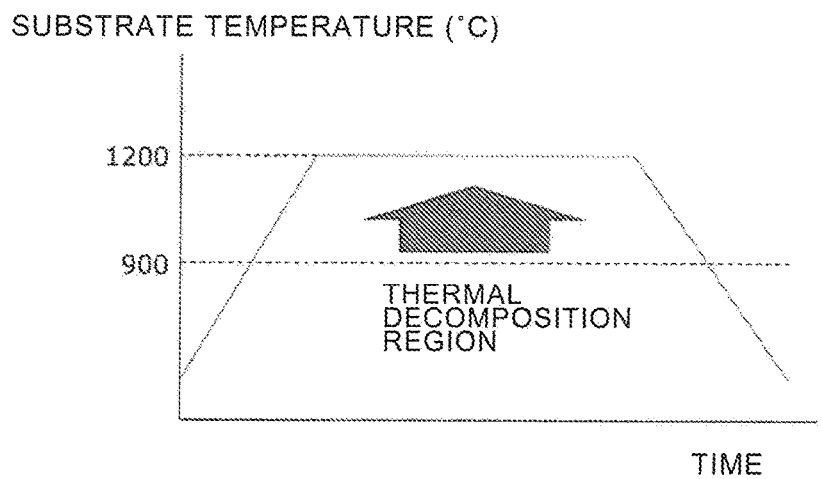
FIG. 3 is a temperature rise profile in the method of manufacturing a group III nitride crystal according to an embodiment of the present disclosure.

The oxidizing gas containing nitrogen element may be supplied before the seed substrate 116 reaches a substrate maximum achieving temperature. In this case, the thermal decomposition of the group III nitride crystal grown on the seed substrate 116 can be suppressed. FIG. 3 shows a temperature rise profile of the substrate temperature when gallium nitride is used for the seed substrate 116. As shown in FIG. 3, the substrate maximum achieving temperature of the seed substrate 116 is 1200° C. When gallium nitride is grown as the group III nitride crystal on the seed substrate 116, the oxidizing gas containing nitrogen element may be supplied before reaching the substrate maximum achieving temperature of 1200° C. so as to suppress the thermal decomposition of gallium nitride. This suppresses generation of Ga droplets due to the thermal decomposition of gallium nitride that is the group III nitride crystal grown on the seed substrate 116. Therefore, the generation of polycrystals, pits, and abnormal growth are suppressed.

<Suppression of Polycrystallization by Supplying Oxidizing Gas Containing Nitrogen Element>

Figure 4A:
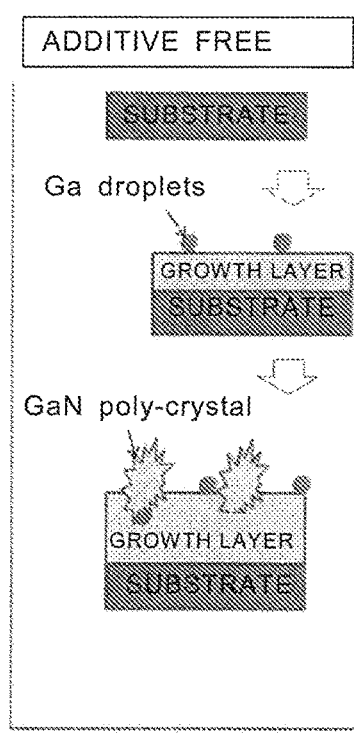
FIG. 4A is a conceptual diagram showing a mechanism of polycrystallization in crystal growth in the method of manufacturing a group III nitride crystal.
Figure 4B:
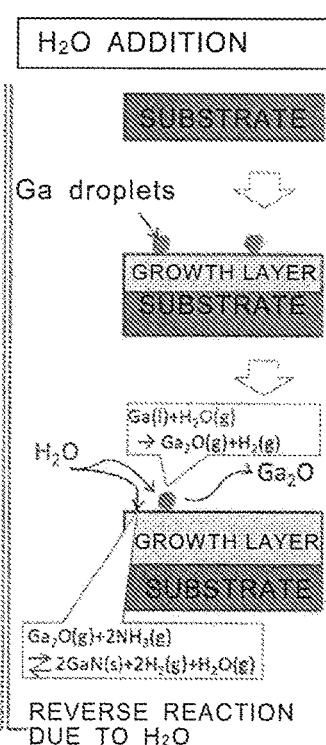
FIG. 4B is a conceptual diagram showing a mechanism of a reverse reaction when $H_2O$ is added.
Figure 4C:
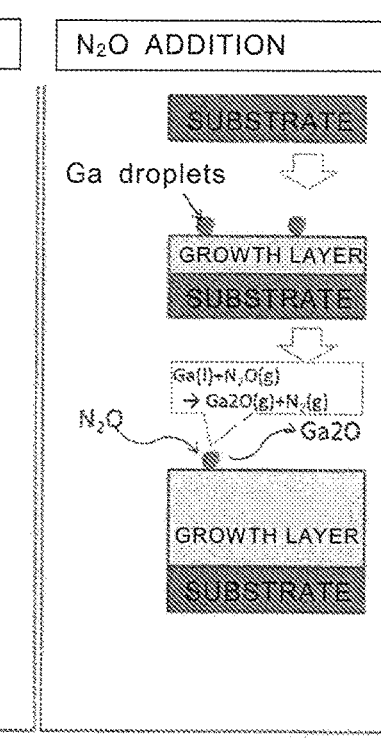
FIG. 4C is a conceptual diagram showing a mechanism of suppression of polycrystallization when $N_2O$ is added.

FIGS. 4A-4C show mechanisms of polycrystallization and suppression thereof in crystal growth of a group III nitride crystal. As shown in FIG. 4A, when a group III nitride crystal is grown on the seed substrate 116, Ga droplets, i.e., group ill element droplets, are generated, so that polycrystallization of the group III nitride crystal occurs. In this regard, as shown in FIG. 4B, Ga droplets can be removed by adding $H_2O$ and the polycrystallization can be prevented to some extent; however, the group III nitride crystal having grown on the seed substrate 116 is etched by $H_2O$. On the other hand, as shown in FIG. 4C, by adding $N_2O$ as the oxidizing gas containing nitrogen element, the Ga droplets, i.e., the group ill element droplets, can be removed to suppress polycrystallization, and since the group III nitride crystal having grown on the seed substrate 116 is hardly etched, the crystal growth rate of the group III nitride crystal is hardly reduced. Therefore, the polycrystallization can be suppressed without causing a reduction in the growth rate of the group III nitride crystal, and the crystal quality is improved.

As shown in FIG. 3, when the substrate temperature of the seed substrate 116 is 900° C. or higher, thermal decomposition is likely to occur in gallium nitride that is the grown group III nitride crystal even when $NH_3$ gas is supplied as the nitrogen element-containing gas. When the substrate temperature of the seed substrate 116 is 1050° C. or higher, the thermal decomposition of gallium nitride that is the grown group III nitride crystal may become significant even when $NH_3$ gas is supplied as the nitrogen element-containing gas. Therefore, when the group III nitride crystal is gallium nitride, the oxidizing gas containing nitrogen element may be supplied from when the substrate temperature of the seed substrate 116 reaches 1050° C., from the viewpoint of suppressing the Ga droplets generated due to the decomposition of gallium nitride. To suppress the droplets due to thermal decomposition of gallium nitride on the seed substrate 116, the oxidizing gas containing nitrogen element may be supplied before the seed substrate 116 reaches the substrate temperature of 1050° C. The oxidizing gas containing nitrogen element may be supplied from when the substrate temperature of the seed substrate 116 reaches 1000° C., and the oxidizing gas containing nitrogen element may be supplied from when the substrate temperature reaches 900° C.

The oxidizing gas containing nitrogen element may be supplied at a partial pressure of $7.00 \times 10^{-4}$ atm or more and $1.75 \times 10^{-3}$ atm or less. In this case, the generation of the group ill element droplets from the group ill nitride crystal growing on the seed substrate 116 can further be suppressed. For example, when gallium nitride is grown as the group ill nitride crystal, the generation of the Ga droplets can particularly be suppressed. The oxidizing gas containing nitrogen element may be supplied at a partial pressure of $7.60 \times 10^{-4}$ atm or more and $1.30 \times 10^{-3}$ atm or less.

To prevent the nitrogen element-containing gas from being decomposed due to heat from the growth chamber 111, outer walls of the nitrogen element-containing gas supply port 113 and the growth chamber 111 may be covered with a heat insulating material.

Parasitic growth of the group III nitride crystal onto a furnace wall of the growth chamber 111 and the substrate susceptor 117 may pose a problem. Therefore, the concentrations of the group III element oxide gas and the nitrogen element-containing gas can be controlled by the second carrier gas supplied from the second carrier gas supply port 114 to the growing chamber 111 to suppress the parasitic growth of the group III nitride crystal onto the furnace wall of the growth chamber 111 and the substrate susceptor 117.

Examples of the seed substrate 116 include gallium nitride, gallium arsenide, silicon, sapphire, silicon carbide, zinc oxide, gallium oxide, and $ScAlMgO_4$.

An inert gas, $H_2$ gas, etc. are usable as the second carrier gas.

The oxidizing gas containing nitrogen element may be supplied so that the gas can easily reach the seed substrate 116. Specifically, in the case of a vertical growth chamber shown in FIG. 2, the gas may be supplied from a portion adjacent to the group III element oxide gas and carrier gas supply port 118.

The unreacted group III element oxide gas, nitrogen element-containing gas, oxidizing gas containing nitrogen element, first carrier gas, and second carrier gas are discharged from the exhaust port 119.

EXAMPLES

Examples 1 and 2 and Comparative Examples 1 to 3

Figure 2:
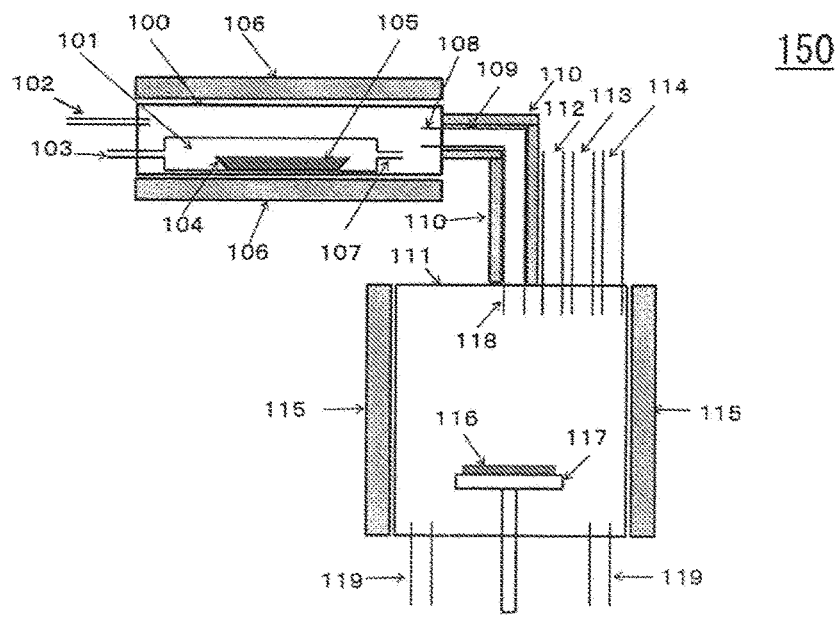
FIG. 2 is a schematic showing a configuration of a group III nitride crystal manufacturing apparatus used in the method for manufacturing a group III nitride crystal according to the first embodiment of the present disclosure.

Group III nitride crystals of Examples 1 and 2 and Comparative Examples 1 to 3 were grown by using the growth furnace shown in FIG. 2. In Examples 1 and 2 and Comparative Examples 1 to 3, GaN was grown as the group ill nitride crystals. Liquid Ga was used as a starting Ga source, Ga was reacted with $H_2O$ gas that is a reactive gas, and $Ga_2O$ gas was used as a Ga source gas. NH gas was used as an N source, and $H_2$ gas and $N_2$ gas were used as the carrier gas. A growth time of 1 hour was used for verification. The growth conditions, the supply partial pressure of each gaseous species, the addition conditions of $H_2O$ serving as the oxygen-containing oxidizing gas, and the addition conditions of $N_2O$ serving as the oxidizing gas containing nitrogen element will be described later. Regarding the growth conditions described later, the supply partial pressure of each gaseous species was calculated as a ratio of each gas flow rate to the total flow rate of the gases flowing into a system. Regarding the supply partial pressure, the total pressure in the system was considered as 1 atm. For example, when a total flow rate into the system is X slm and a gas y flows in at a gas flow rate of Y sim, the partial pressure of the gas y can be represented as (Y/X) atm.

A proportion of a polycrystalline region was calculated for the obtained group III nitride crystals of Examples 1 and 2 and Comparative Examples 1 to 3. The proportion of the polycrystalline region was calculated from a proportion of an area of generated polycrystals by observing a grown crystal surface with an electron microscope. The formula used for the calculation is described as Formula (VI). The observed region is the entire growth surface grown on the seed substrate.

(area of region where polycrystals are generated)/
(area of entire observed region)×100[%]   (VI)

Example 1

For the growth conditions, the substrate temperature was 1200° C. and the raw material temperature was 1100° C. The $Ga_2O$ gas partial pressure was $9.36 \times 10^{-4}$ atm, the $H_2O$ gas partial pressure was $5.95 \times 10^{-4}$ atm, the $NH_3$ gas partial pressure was $5.25 \times 10^{-2}$ atm, the $H_2$ gas partial pressure was $3.33 \times 10^{-1}$ atm, the $N_2$ gas partial pressure was $6.13 \times 10^{-1}$ atm, and the added $N_2O$ gas partial pressure was $8.75 \times 10^{-4}$ atm. In Example 1, the $H_2O$ gas and the $N_2O$ gas were not supplied in a temperature raising process.

The proportion of the polycrystalline region on the GaN growth surface obtained in Example 1 was less than 0.1%, and the growth rate was 122 μm/h.

Example 2

For the growth conditions, the substrate temperature was 1200° C. and the raw material temperature was 1100° C. The $Ga_2O$ gas partial pressure was $9.55 \times 10^{-4}$ atm, the $H_2O$ gas partial pressure was $5.75 \times 10^{-4}$ atm, the $NH_3$ gas partial pressure was $5.25 \times 10^{-2}$ atm, the $H_2$ gas partial pressure was $3.32 \times 10$ atm, the $N_2$ gas partial pressure was $6.12 \times 10^{-1}$ atm, and the added $N_2O$ gas partial pressure was $1.75 \times 10^{-3}$ atm. In Example 2, the $H_2O$ gas and the $N_2O$ gas were not supplied in the temperature raising process.

The proportion of the polycrystalline region on the GaN growth surface obtained in Example 2 was less than 0.5%, and the growth rate was 123 μm/h.

Comparative Example 1

For the growth conditions, the substrate temperature was 1200° C. and the raw material temperature was 1100° C. The $Ga_2O$ gas partial pressure is $9.28 \times 10^{-4}$ atm, the $H_2O$ gas partial pressure is $6.04 \times 10^{-4}$ atm, the NH gas partial pressure was $5.26 \times 10^{-2}$ atm, the $H_2$ gas partial pressure was $3.33 \times 10^{-1}$ atm, and the $N_2$ gas partial pressure was $6.13 \times 10^{-1}$ atm. In Comparative Example 1, none of the $H_2O$ gas nor the $N_2O$ gas was supplied in the temperature raising process.

The proportion of the polycrystalline region on the GaN growth surface obtained in Comparative Example 1 was 2.1%, and the growth rate was 124 μm/h.

Comparative Example 2

For the growth conditions, the substrate temperature was 1200° C. and the raw material temperature was 1100 SC. The $Ga_2O$ gas partial pressure is $9.92 \times 10^{-4}$ atm, the $H_2O$ gas partial pressure is $5.39 \times 10^{-4}$ atm, the $NH_2$ gas partial pressure was $5.25 \times 10^{-2}$ atm, the $H_2$ gas partial pressure was $3.33 \times 10^{-1}$ atm, the $N_2$ gas partial pressure was $6.13 \times 10^{-1}$ atm, and the added $H_2O$ gas partial pressure was $8.75 \times 10^{-4}$ atm. In Comparative Example 2, the $H_2O$ gas and the $N_2O$ gas were not supplied in the temperature raising process.

The proportion of the polycrystalline region on the GaN growth surface obtained in Comparative Example 2 was 1.4%, and the growth rate was 130 μm/h.

Comparative Example 3

For the growth conditions, the substrate temperature was 1200° C. and the raw material temperature was 1100° C. The $Ga_2O$ gas partial pressure is $9.22 \times 10^{-4}$ atm, the $H_2O$ gas partial pressure is $6.09 \times 10^{-4}$ atm, the $NH_3$ gas partial pressure was $5.25 \times 10^{-2}$ atm, the $H_2$ gas partial pressure was $3.32 \times 10^{-1}$ atm, the $N_2$ gas partial pressure was $6.12 \times 10^{-1}$ atm, and the added $H_2O$ gas partial pressure was $1.31 \times 10^{-3}$ atm. In Comparative Example 3, the $H_2O$ gas and the $N_2O$ gas were not supplied in the temperature raising process.

The proportion of the polycrystalline region on the GaN growth surface obtained in Comparative Example 3 was less than 0.1%, and the growth rate was 109 μm/h.

Discussion of Examples 1 and 2 and Comparative Examples 1 to 3

Figure 5:
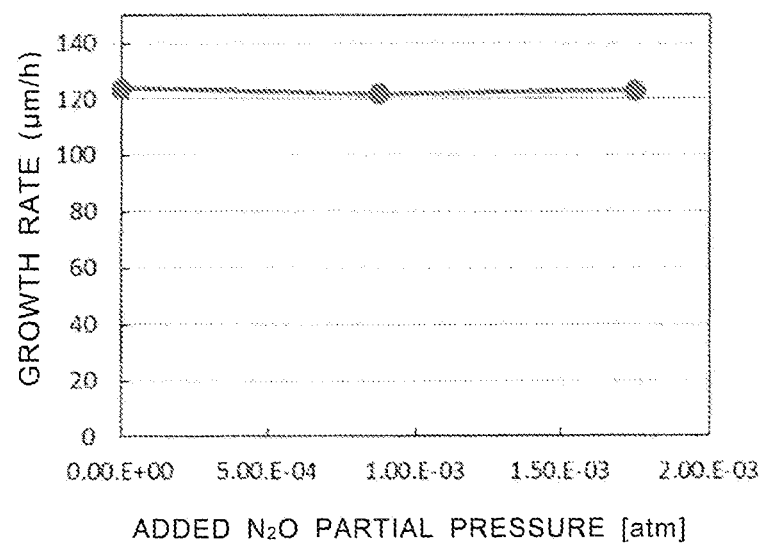
FIG. 5 is a graph showing a relationship between an added $N_2O$ partial pressure and a growth rate.
Figure 6:
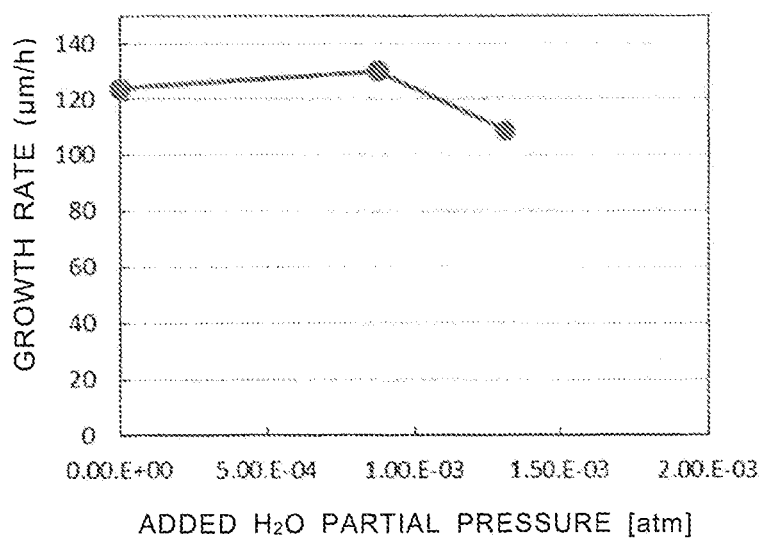
FIG. 6 is a graph showing a relationship between an added $H_2O$ partial pressure and a growth rate.

FIG. 5 shows a graph representing a relationship between the added $N_2O$ partial pressure and the growth rate based on the results of Comparative Example 1 and Examples 1 and 2. FIG. 6 shows a graph showing a relationship between the added $H_2O$ partial pressure and the growth rate based on the results of Comparative Examples 1 to 3.

As can be seen from FIG. 5, a reduction in the growth rate was not confirmed to the $N_2$) gas addition amount of $1.75 \times 10^{-3}$ atm. In contrast, as can be seen from FIG. 6, in the case of the addition of $H_2O$ gas, although the growth rate was 124 μm/h when not added, the growth rate was reduced to $1.31 \times 10^{-3}$ atm at the $H_2O$ gas addition amount of $1.31 \times 10^{-3}$ atm, so that about 12% reduction in the growth rate was confirmed.

Figure 7:
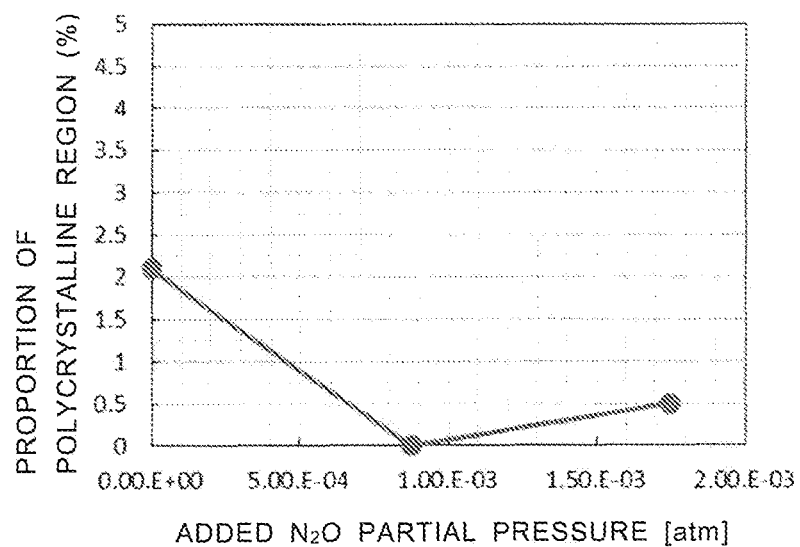
FIG. 7 is a graph showing a relationship between an added $N_2O$ partial pressure and a proportion of polycrystalline region.
Figure 8:
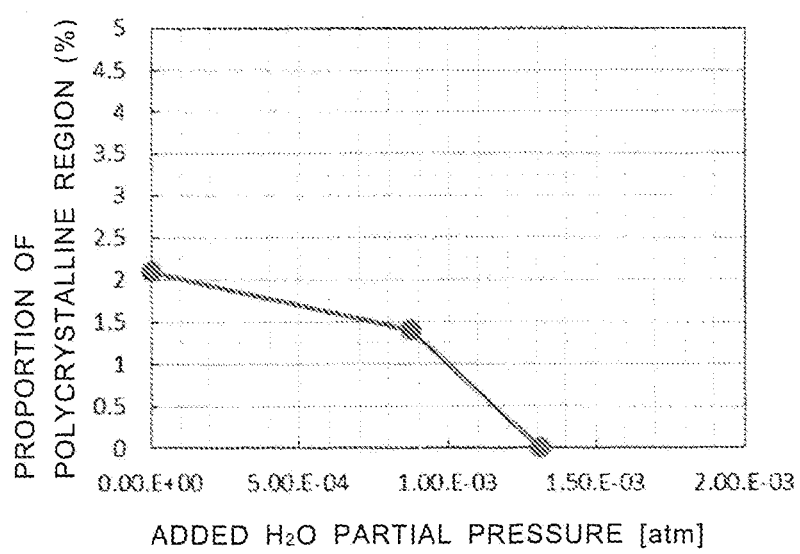
FIG. 8 is a graph showing a relationship between a partial pressure of added $H_2O$ and a proportion of polycrystalline region.

FIG. 7 shows a graph representing a relationship between the added $N_2O$ partial pressure and the proportion of the polycrystalline region based on the results of Comparative Example 1 and Examples 1 and 2. FIG. 8 shows a graph representing a relationship between the added $H_2O$ partial pressure and the proportion of the polycrystalline region based on the results of Comparative Example 1 to 3. In the case of addition of $N_2O$, the proportion of the polycrystalline region was less than 0.1% at the addition amount of $8.75 \times 10^{-4}$ atm, and the proportion of the polycrystalline region was 0.5% even at the addition amount of $1.75 \times 10^{-3}$ atm. On the other hand, in the case of addition of $H_2O$, the proportion of the polycrystalline region was 1.4% at the addition amount of $8.75 \times 10^{-4}$ atm, and the polycrystalline region was larger than the case of addition of $N_2O$. When $H_2O$ was added in an addition amount of $1.31 \times 10^{-3}$ atm, the proportion of the polycrystalline region was less than 0.1%; however, the growth rate was slowed to 109 μm/h as shown in FIG. 6.

From the above, considering the results of the growth rate and the proportion of the polycrystalline region together, it can be seen that when $N_2O$ gas is added, the generation of polycrystals can be suppressed without reducing the growth rate as compared to when $H_2O$ gas is added. When a wafer is used for device fabrication, a region of generation of polycrystals cannot drive the device due to a disordered crystal structure. Therefore, the region of generation of polycrystals can be considered as a region that cannot be used for device fabrication. Therefore, polycrystallization is suppressed by adding $N_2O$ gas, so that a high-quality group III nitride crystal can be obtained, and the group III nitride crystal can efficiently be manufactured.

Example 3 and Comparative Example 4 an experiment was conducted by using the growth furnace shown in FIG. 2 to confirm a droplet removal state in the process of raising the temperature of the group III nitride crystal of Example 3 and Comparative Example 4. In Example 3 and Comparative Example 4, a GaN crystal was not grown and a GaN substrate was used as the group III nitride crystal. $NH_3$ gas was used as the N source, and $H_2$ gas and $N_2$ gas were used as the carrier gas. Since $Ga_2O$ was not supplied in Example 3 and Comparative Example 4, no new GaN crystal was grown. A temperature raising time of 30 minutes was used for verification. The temperature raising conditions, the supply partial pressure of each gaseous species, and the addition conditions of $N_2O$ serving as the oxidizing gas containing nitrogen element will be described later. The supply partial pressure of each gaseous species was calculated as a ratio of each gas flow rate to the total flow rate of the gases flowing into a system. Regarding the supply partial pressure, the total pressure in the system was considered as 1 atm. For example, when a total flow rate into the system is X slm and a gas y flows in at a gas flow rate of Y slm, the partial pressure of the gas y can be represented as (Y/X) atm.

The surfaces of the GaN substrates of Example 3 and Comparative Example 4 were observed with a differential interference microscope, and the number of generated polycrystals per unit area was calculated and used as a polycrystal density.

Example 3

For the temperature raising conditions, heating was performed to the substrate temperature of 1200° C. and the raw material temperature of 1100° C. The added $N_2O$ gas was supplied after the substrate temperature reached 1000° C. When the added $N_2O$ gas was supplied, the partial pressures of the gases were set to the $NH_3$ gas partial pressure of $9.08 \times 10^{-1}$ atm, the $N_2$ gas partial pressure of $9.08 \times 10^{-2}$ atm, and the added $N_2O$ gas partial pressure of $9.08 \times 10^{-4}$ atm. When the substrate temperature was less than 1000° C., the partial pressures of the gases were set to the $NH_3$ gas partial pressure of $9.09 \times 10^{-3}$ atm and the $N_2$ gas partial pressure of $9.09 \times 10^{-2}$ atm. Subsequently, the $NH_3$ gas partial pressure was set to 0.77 atm, the $N_2$ gas partial pressure was set to 0.23 atm, and after the substrate temperature was reduced to 500° C., the substrate temperature was reduced to room temperature in an $N_2$ atmosphere. After the temperature rise and fall of the GaN substrate of Example 3, the polycrystalline density was 172 pieces/mm².

Comparative Example 4

For the temperature raising conditions, heating was performed to the substrate temperature of 1200° C. and the raw material temperature of 1100° C. In Comparative Example 4, $N_2O$ gas was not added. The partial pressures of the gases were set to the $NH_3$ gas partial pressure of $9.09 \times 10^{r1}$ atm and the $N_2$ gas partial pressure of $9.09 \times 10^{-2}$ atm.

As a result of the temperature rise and fall of the GaN substrate of Comparative Example 4, the polycrystalline density was 1437 pieces/mm².

Discussion of Example 3 and Comparative Example 4

From the results of Example 3 and Comparative Example 4, it was confirmed that by adding $N_2O$ gas, the Ga droplets generated from the GaN substrate were favorably removed and polycrystallization was suppressed.

The present disclosure includes appropriately combining any embodiments and/or examples out of the various embodiments and/or examples described above, and the effects of the respective embodiments and/or examples can be produced.

According to the method of manufacturing a group III nitride crystal according to the present invention, polycrystallization can be suppressed, and the group III nitride crystal can be manufactured at a high growth rate, by supplying an oxidizing gas containing nitrogen element.

EXPLANATIONS OF LETTERS OR NUMERALS 100 raw material chamber
101 raw material reaction chamber
102 first carrier gas supply port
103 reactive gas supply pipe
104 raw material boat
105 starting group III element source
106 first heater
107 group III element oxide gas discharge port
108 group III element oxide gas and carrier gas discharge port
109 connection pipe
110 third heater
111 growth chamber
112 oxidizing gas containing nitrogen element supply port
113 nitrogen element-containing gas supply port
114 second carrier gas supply port
115 second heater
116 seed substrate
117 substrate susceptor
118 group III element oxide gas and carrier gas supply port
119 exhaust port
150 group III nitride crystal manufacturing apparatus

The invention claimed is:

1. A method of manufacturing a group III nitride crystal comprising:
preparing a seed substrate in a growth chamber followed by heating the growth chamber to a growth temperature of 1,000 to 1,800° C.;
generating a group III element oxide gas;
supplying the group III element oxide gas to the growth chamber;
supplying a nitrogen element-containing gas to the growth chamber;
supplying an oxidizing gas containing nitrogen element containing at least one selected from the group consisting of NO gas, $NO_2$ gas, $N_2O$ gas, and $N_2O_4$ gas to the growth chamber, wherein the oxidizing gas containing nitrogen element is supplied before the seed substrate reaches a substrate temperature of 1050° C.;
reacting the oxidizing gas containing nitrogen element with a group III element droplet formed on a surface of the seed substrate; and
growing the group III nitride crystal on the seed substrate.

2. The method of manufacturing a group III nitride crystal according to claim 1, wherein the oxidizing gas containing nitrogen element is supplied at a partial pressure of $7.00 \times 10^{-4}$ atm or more and $1.75 \times 10^{-3}$ atm or less.

3. The method of manufacturing a group III nitride crystal according to claim 1, wherein the oxidizing gas containing nitrogen element is supplied at a partial pressure of $7.60 \times 10^{-4}$ atm or more and $1.30 \times 10^{-3}$ atm or less.

* * * * *